US009560922B2

(12) United States Patent
Wunner et al.

(10) Patent No.: US 9,560,922 B2
(45) Date of Patent: Feb. 7, 2017

(54) SHELF-MOUNTABLE VIDEO DISPLAY UNIT

(71) Applicant: United Wire Craft Inc., Des Plaines, IL (US)

(72) Inventors: Douglas George Wunner, Sycamore, IL (US); Anita Rosenblum Michals, Chicago, IL (US)

(73) Assignee: UNITED WIRE CRAFT INC., Des Plaines, IL (US)

( * ) Notice: Subject to any disclaimer, the term of this patent is extended or adjusted under 35 U.S.C. 154(b) by 60 days.

(21) Appl. No.: 14/482,787

(22) Filed: Sep. 10, 2014

(65) Prior Publication Data

US 2016/0073522 A1 Mar. 10, 2016

(51) Int. Cl.
*G06F 1/16* (2006.01)
*A47F 5/00* (2006.01)
(Continued)

(52) U.S. Cl.
CPC ............. *A47F 5/0043* (2013.01); *A47F 10/00* (2013.01); *F16M 13/00* (2013.01); *G06F 1/16* (2013.01);
(Continued)

(58) Field of Classification Search
CPC ........ G06F 3/0488; G06F 1/165; G06F 21/36; G06F 2203/04103; G06F 2203/04108; G06F 3/03547; G06F 3/041; G06F 1/16; F16M 13/00; F16M 13/02; G09F 13/00; G09F 3/204; G09F 3/208; H04N 5/64; H05K 5/0017; H05K 1/11; H05K 5/0204; H05K 5/0217; H05K 7/1427; H05K 5/0086; A47F 11/06; A47F 5/0043; A47F 5/0068
(Continued)

(56) References Cited

U.S. PATENT DOCUMENTS 5,867,140 A * 2/1999 Rader ................... G09G 5/363
345/100
7,152,040 B1 12/2006 Hawthorne et al.
(Continued)

FOREIGN PATENT DOCUMENTS

WO 98/58320 12/1998

OTHER PUBLICATIONS

Americhip, In-Store Marketing Catalog dated 2012, 27 pages.
(Continued)

*Primary Examiner* — Anthony Haughton
*Assistant Examiner* — Ingrid Wright
(74) *Attorney, Agent, or Firm* — McAndrews, Held & Malloy, Ltd.

(57) ABSTRACT

The present invention is directed to video display units that are specifically configured for mounting to a retail shelf, such as to display product information, brand information, retailer information or combinations thereof. The shelf-mountable video display unit is configured to be manufactured in few pieces and using low-cost components and materials, thereby providing a product has significant economic advantages over conventional digital signage. The shelf-mountable video display unit is also configured such that it is easily reusable and repurposable. For instance, the present shelf-mountable video display unit may be easily adapted and customized to provide for the marketing of various products and brands throughout its lifetime. The shelf-mountable video display unit is also specifically configured to withstand the stresses of the retail environment.

19 Claims, 7 Drawing Sheets

(51) Int. Cl.
*A47F 10/00* (2006.01)
*H05K 5/00* (2006.01)
*H05K 5/02* (2006.01)
*G09F 13/00* (2006.01)
*G09F 3/20* (2006.01)
*F16M 13/00* (2006.01)
*H04N 5/64* (2006.01)
*A47F 11/06* (2006.01)

(52) U.S. Cl.
CPC .............. *G09F 3/204* (2013.01); *G09F 3/208* (2013.01); *G09F 13/00* (2013.01); *H04N 5/64* (2013.01); *H05K 5/0017* (2013.01); *H05K 5/0086* (2013.01); *H05K 5/0204* (2013.01); *A47F 5/0068* (2013.01); *A47F 11/06* (2013.01)

(58) Field of Classification Search
USPC .................... 361/679.01, 679.02, 679.09, 679.21, 361/679.22, 679.26, 679.27; 248/917–924
See application file for complete search history.

(56) References Cited

U.S. PATENT DOCUMENTS

| | | | |
|---|---|---|---|
| 8,098,396 B2 * | 1/2012 | Lapstun | B41J 3/445 358/1.15 |
| 8,231,017 B2 | 7/2012 | Clontz et al. | |
| 2003/0115096 A1 | 6/2003 | Reynolds et al. | |
| 2005/0246188 A1 * | 11/2005 | DeSimone | G06Q 10/10 345/173 |
| 2010/0245995 A1 * | 9/2010 | Graetz | H04N 5/7408 359/450 |
| 2011/0320278 A1 * | 12/2011 | Littman | G06Q 30/0261 705/14.58 |
| 2012/0120327 A1 | 5/2012 | Marx et al. | |
| 2013/0117153 A1 | 5/2013 | Shen | |
| 2013/0202269 A1 | 8/2013 | Rossiter et al. | |
| 2015/0170215 A1 * | 6/2015 | McConnell | G06Q 30/0268 705/14.65 |

OTHER PUBLICATIONS

Display Solution Shelf Vision pamphlet, 4 pages, http://www.display-solution.com/pdf/intelligente_tfts/shelf_vision_pos_monitor.pdf, downloaded on Jun. 1, 2014.
"Infoscreen", www.infoshade.com/infoscreen.html, 4 pages, dated Dec. 17, 2014.
"Welcome to TV in a Card—Home of Video Brochures and Point of Sale Screens", www.tvinacard.co.uk, 2 pages, dated Dec. 17, 2014.
"Data Display Systems", www.dd-usa.com/audio.html, 2 pages, dated Dec. 17, 2014.
"Outform—iDislay iShelf 2", www.outform.com/idisplay/ishelf/ishelf-2, 2 pages, dated Dec. 17, 2014.
Duco Technologies, Inc., www.ducotech.com, 2 pages, dated Dec. 17, 2014.
"Americhip: Safilo Shelf Talker", www.americhip.com/vid/safilo-shelf-talker.html, 2 pages, dated Dec. 17, 2014.

* cited by examiner

SHELF-MOUNTABLE VIDEO DISPLAY UNIT

BACKGROUND OF THE INVENTION

The present invention is directed to video display units that are specifically configured for mounting to a retail shelf, such as to display product information, brand information, or the like.

The use of digital signage in the retail space continues to become more widespread. Digital signage for the retail space, however, remains costly. Accordingly, digital signage is often supplied by a specific brand and may be attached directly to a specially designed product display unit. Some conventional digital signage is also not adequately configured to withstand the stresses of the retail environment. The inventors have presently developed a new shelf-mountable video display unit for the retail space that overcomes many of the limitations of conventional digital signage for the retail space.

The present shelf-mountable video display unit is configured to be manufacturable using low-cost components and materials, thereby providing a product that is less than one-half of the cost of conventional retail shelf monitors. The present shelf-mountable video display unit may be attached to standard retail shelving and is configured such that it is easily reusable and repurposable. For instance, the present shelf-mountable video display unit may be easily adapted and customized for the marketing of numerous unrelated products and/or brands throughout its lifetime. The present shelf-mountable video display unit is also configured to withstand the stresses of the retail environment. For example, the present unit has a two component design, comprising a video display mounted to the front of a retail shelf and a remote battery pack mounted to the underside of a retail shelf, for example a distance back from the front of the shelf. This provides the unit with a low profile that does not protrude into the aisle or other customer space, which reduces breakage and increases customer safety.

SUMMARY OF THE INVENTION

One aspect of the present invention is directed to a shelf-mountable video display unit that comprises a video component and a protective housing for the video component. The video component is made up of at least an LCD screen and an integrated circuit and is configured for the playing of video on the screen. The housing encloses the video component and protects the video component from some of the hazards of the retail environment. The housing is made up of a front panel and a rear panel. The two portions of the housing are detachably secured together, such as by a snap-fit or by screws or the like, so that they may be separated by the retailor or owner in order to access the video component. The front panel of the housing includes at least a face and a mounting element. The mounting element is configured to be detachably secured to a conventional retail shelf, such as through bolts or the like. The mounting element may desirably be configured to rest on top of the retail shelf for easy securement. In some embodiments, the face of the front panel of the housing and the mounting element may be integral with one another, which provides for a housing that is only two pieces (front panel and rear panel), thus lowering the cost of manufacture.

In some embodiments, the shelf-mountable video display unit may also comprise a remote battery pack. The battery pack is desirably configured to mount to the underside of the retail shelf, so that it may be substantially concealed from view by shoppers. For example, in some embodiments the battery pack may be configured to mount to the underside of a conventional metal retail shelf through the use of magnets on the battery pack. In some embodiments, the battery pack housing may be a single piece having an integral closure, thereby limiting the cost of manufacture. The battery pack is configured to electrically connect with the video component through a cable or the like. In some embodiments, the cable may be connected to one of the video component and the battery pack by a plug that is configured to automatically disconnect in response to the application of force to the video display unit in a direction away from the battery pack.

Another aspect of the present invention is directed to a shelf-mountable video display unit that comprises a video component, a graphic border for the video component, and a protective housing that encloses the video component and the graphic border. The video component is made up of at least an LCD screen, an integrated circuit, and a memory card reader, and is configured for the playing of video on the screen from an insertable memory card. The graphic border, which may be made of card stock or the like for example, surrounds the screen and typically includes one or more of retailor, brand, and product names and/or information. The housing encloses the video component and the graphic border, protecting both from the hazards of the retail environment. The housing is made up of at least a front panel and a rear panel. The two portions of the housing are detachably secured together, such as by a snap-fit or by screws or the like, so that they may be separated by the retailor or owner in order to access the video component and/or the graphic border. The housing may also be configured to mount to a retail shelf such that the screen hangs below the shelf.

A shelf-mountable video display unit such as that described above may be repurposed through a relatively simple and straightforward process. One may simply separate the front panel and the rear panel of the housing, for example by loosening or removing fasteners that secure the two portions together, in order to access the interior of the housing. If desired, one may then replace the memory card with a different memory card, such as one that contains different video content. If desired, one may also independently replace the graphic border with one that contains different information. When one has replaced the memory card, the graphic border, or both, one simply reattaches the front panel and the rear panel of the housing, for example by tightening or replacing the fasteners that secure the two portions together.

In some embodiments, the shelf-mountable video display unit described above may also comprise a remote battery pack. The battery pack is desirably configured to mount to the underside of the retail shelf, so that it may be substantially concealed from view by shoppers. For example, the battery pack may be configured to mount to the underside of a conventional metal retail shelf through the use of magnets on the battery pack. The battery pack is configured to form an electrical connection with the video component by a cable or the like. In some embodiments, the cable may be connected to one of the video component and the battery pack by a plug that is configured to automatically disconnect in response to the application of force to the video display unit in a direction away from the battery pack.

Additional features and advantages will be set forth in the detailed description which follows, and in part will be readily apparent to those skilled in the art from that description or recognized by practicing the embodiments as described herein, including the detailed description which follows, the claims, and the appended drawings.

It is to be understood that both the foregoing general description and the following detailed description are merely exemplary, and are intended to provide an overview or work to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

BRIEF DESCRIPTION OF THE DRAWINGS

A clear conception of the advantages and features of one or more embodiments will become more readily apparent by reference to the exemplary, and therefore non-limiting, embodiments illustrated in the drawings.

DETAILED DESCRIPTION OF THE INVENTION

Figure 1:
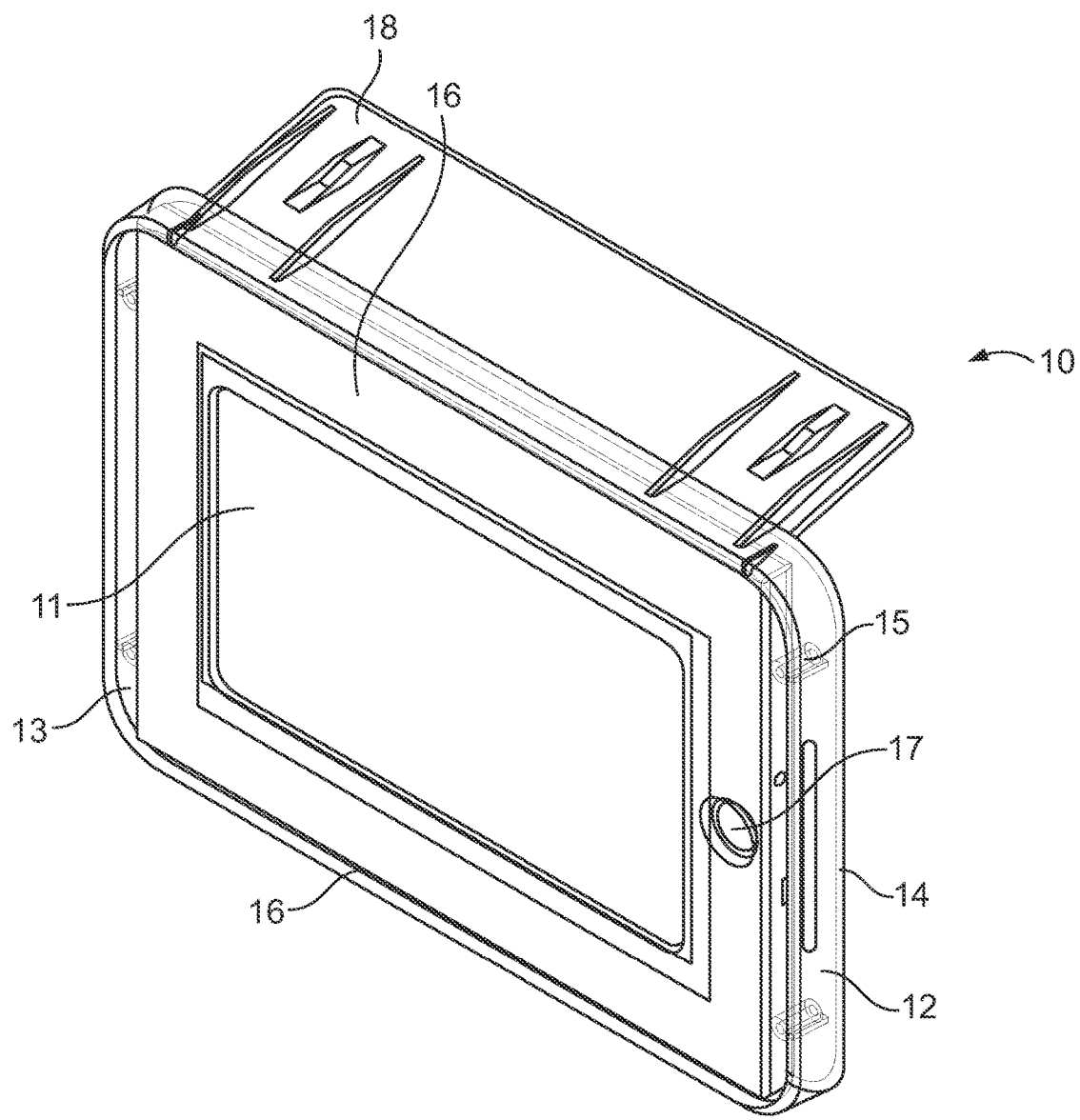
FIG. 1 is a front perspective view of an embodiment of a shelf-mountable video display unit.
Figure 2:
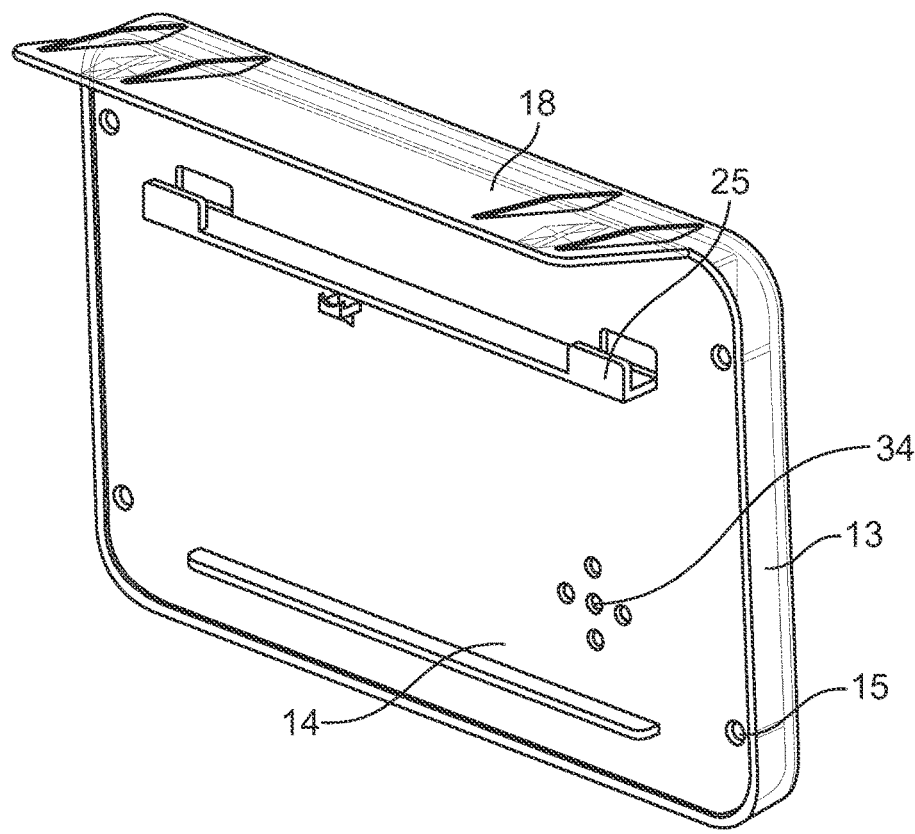
FIG. 2 is a rear perspective view of an embodiment of a shelf-mountable video display unit.
Figure 3:
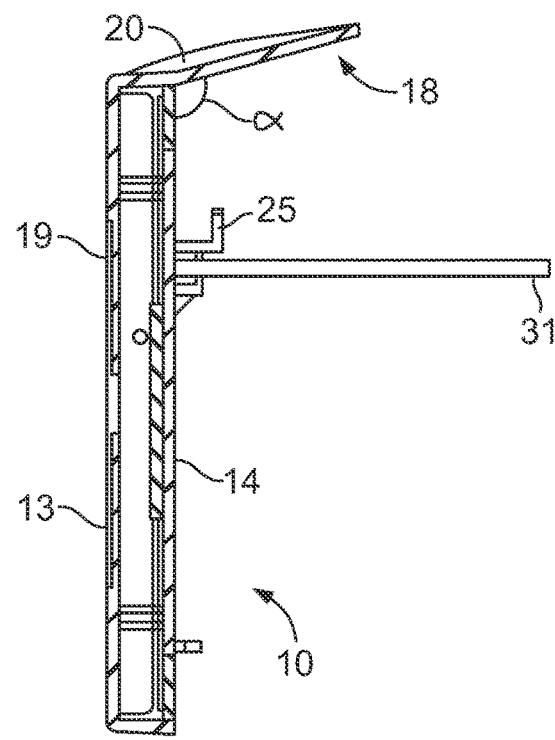
FIG. 3 is a side elevation view of an embodiment of a shelf-mountable video display unit.

An embodiment of the shelf-mountable video display unit is illustrated in FIGS. 1 to 3. The video display unit 10 includes a video component 11 that comprises at least a video screen and an integrated circuit. The video component 11 is protected by, and in some embodiments enclosed by, a housing 12. The housing 12 comprises at least a front panel 13 and a rear panel 14. The front panel 13 and the rear panel 14 may be detachably secured together, such as by screws or other fasteners 15 or by a snap-fit configuration. The video screen may be surrounded by a graphic border 16, which may contain images, text, or both that serve to identify and/or describe particular products, brands, retailers, or combinations thereof. The video component may be activated by one or more buttons 17, which are preferably visible on the front of the video display unit 10. The video display unit 10 also comprises a mounting element 18 that is configured for mounting the video display unit to a conventional retail shelf.

The term conventional retail shelf is meant to include the full array of standard shelving that is used in the commercial retail environment. While the standard shelves and shelving units may contain minor differences from one another, such as may be the result of being produced by different manufacturers, these differences have been taken into account by the present invention. Accordingly, these minor differences may not be used to exclude any of the standard retail shelves from the scope of the term.

Figure 4:
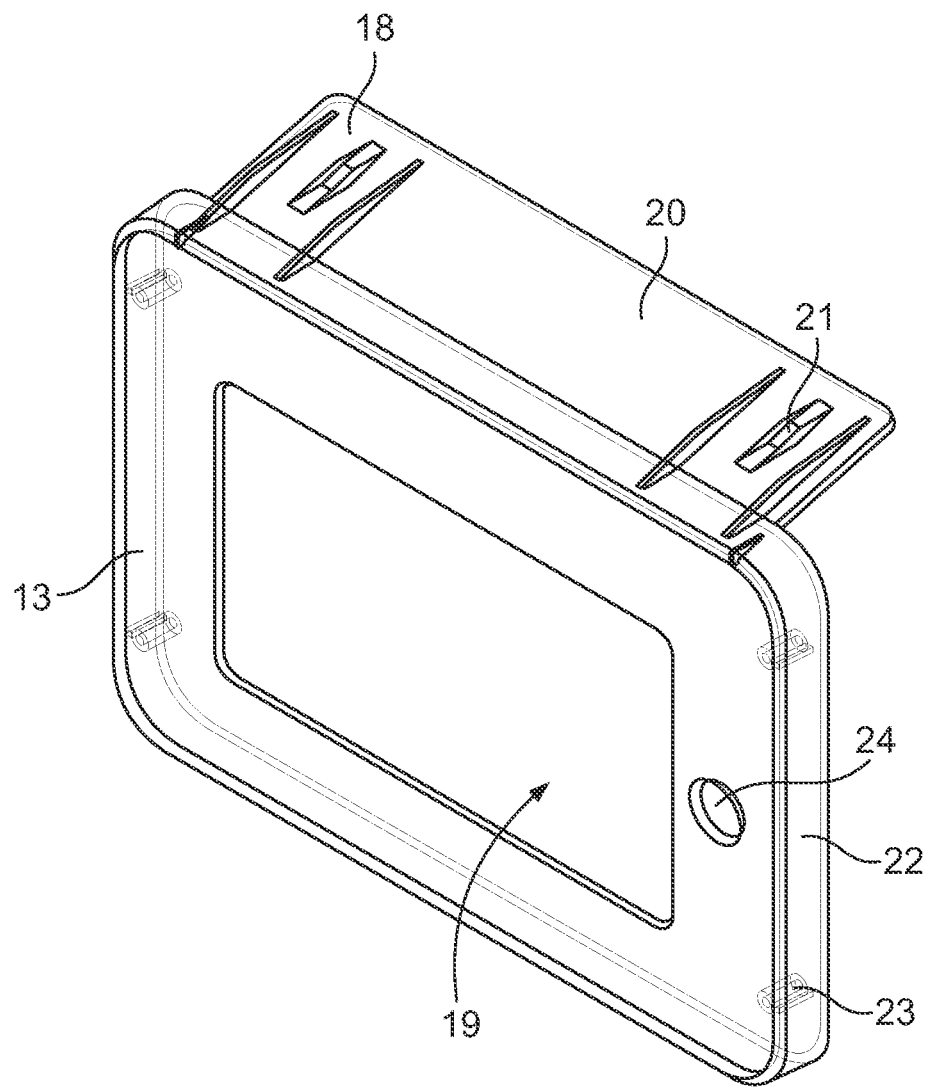
FIG. 4 is a front perspective view of the front panel of the housing in an embodiment of a shelf-mountable video display unit.

In some embodiments, the mounting element 18 may be part of the front panel 13 of the housing. For example, as illustrated in FIG. 4, the front panel 13 may comprise a face 19 and a mounting element 18. Desirably, the face 19 and the mounting element 18 may be integral with one another. The face 19 and the mounting element 18 may be manufactured so as to be integral with one another using techniques that would be understood by a person of skill in the art. For example, the front panel 13 of the housing may be an injection molded polymeric material and the face 19 and mounting element 18 may be integrally molded. Alternatively, the front panel 13 of the housing may be manufactured by other known techniques, such as other molding techniques, die cutting, extrusion, 3D printing, or heat bending. By providing a front panel 13 in which the face 19 and the mounting element 18 are integral with one another, one may ensure that the housing consists of only two pieces (a front panel 13 and a rear panel 14), each of which can be manufactured at relatively low cost.

The front panel 13 may be manufactured from any material that is suitable for attachment to the back panel to create the housing 12. In some embodiments, the front panel 13 may be a polymeric material, or plastic. The polymeric material used to manufacture the front panel 13 desirably is of a suitable strength to provide a mounting element 18 that can withstand the stresses of retail use. In some embodiments, for example, the front panel 13 may be a high strength plastic, such as a polycarbonate or PETG. In some embodiments, the polymeric material may also be substantially transparent, at least in part, such that one can view the video screen through the front panel 13 with little or no distortion. A clear polycarbonate material, for example, is able to fulfill both of these functions. Other materials that may be especially suitable for the front panel 13 include clear PETG, clear K-resin, clear PVC, and engineering grade acrylic. In alternative embodiments, the front panel 13 may be manufactured from non-polymeric materials, such as metals. For instance, in one embodiment, the front panel 13 may be manufactured of aluminum.

As illustrated in FIG. 4, the mounting element 18 may comprise a pane 20 that extends rearward from the top surface of the face 19. For example, in the embodiment shown, the underside of the pane 20 is configured to sit on the upper surface of a conventional retail shelf. The pane 20 comprises one or more slots 21, through which bolts, screws, rivets, clips, or other fasteners may be used to securely attach the video display unit 10 to the retail shelf. Desirably, the pane 20 comprises at least two slots 21 in order to provide for a secure and balanced attachment between the mounting element 18 and the retail shelf. Where the pane 20 is molded, the one or more slots 21 may desirably be formed in the direction of draw to avoid costly mold processing. Once the mounting element 18 is securely attached to the retail shelf, the body of the video display unit 10 will extend downward past the front edge of the retail shelf. This configuration provides that the video screen 35 and the graphic border 16 may be positioned so as to be readily and easily viewable by customers within the retail space while not taking up valuable shelf space and thereby lessening the product display capacity of the retail shelf.

In order to provide a customer with an effective viewing angle of the video screen 35, the face 19 and the pane 20 may be configured to form a particular angle. The angle, identified as α, may be measured as shown in FIG. 3. In some embodiments, the angle α may be between about 85 and about 125 degrees. Alternatively, the angle α may be between about 90 and about 120 degrees. Alternatively, the angle α may be between about 95 and about 115 degrees. Alternatively, the angle α may be between about 100 and about 110 degrees. Alternatively, the angle α may be about 105 degrees.

In alternative, non-illustrated embodiments, the mounting element may instead be configured such that the upper surface of the pane 20 may be secured to the underside of a retail shelf.

In some embodiments, the face 19 of the front panel is desirably configured to cover and protect the video screen while also allowing for viewing of the video screen with little or no distortion. For example, the face 19 may be substantially flat or may be configured, such as is illustrated in the embodiment shown in FIG. 4, to comprise a slight indent or a slight protrusion that matches up with the periphery of the video screen when the video display unit 10 is fully assembled. In some embodiments, the portion of the face 19 that matches up with video screen may be configured to have an increased transparency over other portions of the front panel 13. For example, portions of the face 19 may be polished on one or both sides in order to prevent distortion of the video screen.

In alternative embodiments, the face 19 of the front panel may not cover the video screen. Rather, the face 19 of the front panel may comprise an opening in the center through which the video screen may be viewed. In these embodiments, the face 19 of the front panel may optionally be formed from an opaque material.

The face 19 of the front panel may be bordered on each edge by a sidewall 22, the sidewall being configured to provide the housing 12 with the necessary depth to enclose the video component 11. In alternative, non-illustrated embodiments, the sidewall 22 may extend from the rear panel 14 of the housing.

In some embodiments, the face 19 of the front panel may also comprise one or more screw bosses 23 or the like, which allow for the securement of the front panel 13 and the rear panel using screws, clips, or other such fasteners 15. In some embodiments, the screw bosses 23 or the like may be located at or near each corner of the face 19. This configuration provides for a secure connection between the front panel 13 and the rear panel 14, and thus a full enclosure of the video component 11 within the housing 12. In other embodiments, the front panel 13 and the rear panel 14 may be configured to form a snap-fit connection with one another. By providing that the front panel 13 and the rear panel 14 may be snapped together, one may reduce or eliminate the need for fasteners. Accordingly, the housing could be configured so that the front panel 13 and the rear panel 14 could be separated, such as in order to change the memory card and/or the graphic border, without requiring any tooling.

The face 19 of the front panel may also comprise one or more openings 24, the one or more openings being configured to align with and surround the one or more buttons 17 that may be used to activate the video component 11. In some embodiments, the video display unit 10 may be configured so that the one or more buttons 17 protrude through the one or more openings 24, thereby extending from the face 19 of the front panel. In other embodiments the video display unit 10 may be configured so that the one or more buttons 17 sit substantially flush with the face 19 of the front panel. In some embodiments, the one or more openings 24 may be covered by a flexible material configured to allow for the pressing of the one or more buttons 17 while also preventing dust and the like from entering the enclosure that may be formed by the housing 12.

Figure 5A:
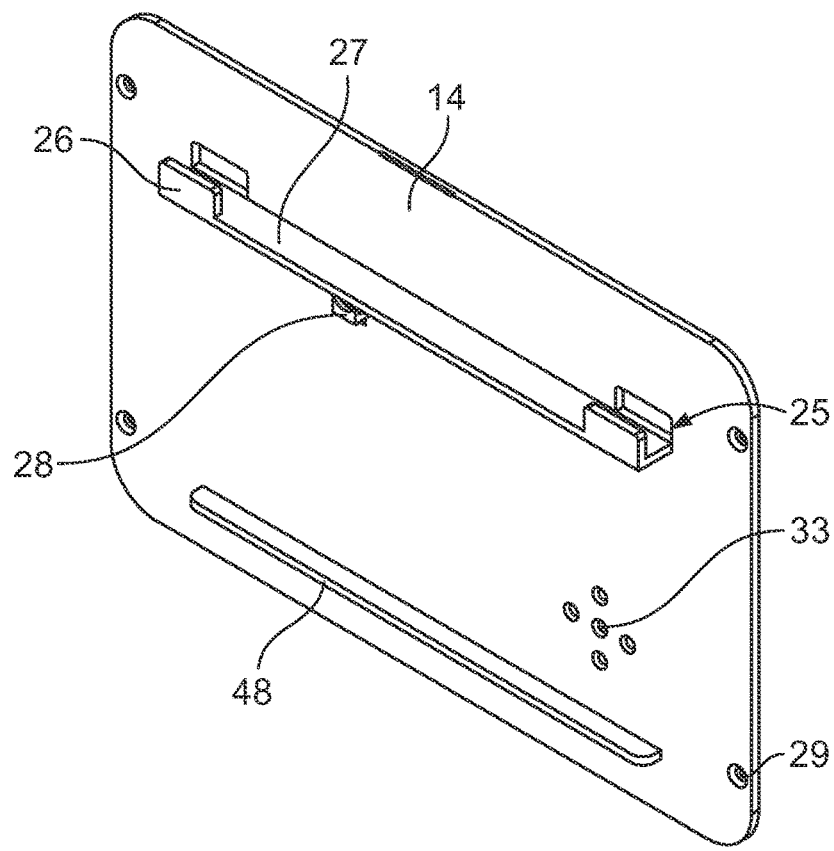
FIG. 5A is a rear perspective view of the rear panel of the housing in an embodiment of a shelf-mountable video display unit.

An embodiment of the rear panel 14 of the housing is illustrated in FIG. 5. The rear panel 14 may be an injection molded polymeric material. The polymeric material used to prepare the rear panel may be any known polymer that can be detachably and securely attached to the front panel 13 of the housing. Desirably, the rear panel 14 may be made of a low-cost polymeric material, such as acrylonitrile butadiene styrene, high impact polystyrene, polyethylene, polypropylene, polyvinyl chloride (PVC), glycol-modified polyethylene terephthalate (PETG), or nylon.

In some embodiments, the rear panel 14 of the housing may comprise one or more stabilizers 25. The one or more stabilizers 25 are configured to stabilize the video display unit 10 against the retail shelf on which it is mounted, for instance by engaging the retail shelf so as to restrict movement of the video display unit. Desirably, the one or more stabilizers 25 are integrally molded with the rear panel 14. The embodiment illustrated in FIG. 5A comprises a stabilizer 25 having pair of upward hook-shaped protrusions 26 that are separated by a platform 27. The stabilizer 25 is configured to fit under the front panel of a retail shelf, such that the upward hook-shaped protrusions 26 engage the backside of the retail shelf front panel to inhibit the video display unit 10 from being pulled away from the retail shelf. The platform 27 may also engage with the bottom edge of the retail shelf front panel to restrict movement of the video display unit 10, such as to inhibit the video display unit 10 from being lifted upward away from the retail shelf.

Figure 5B:
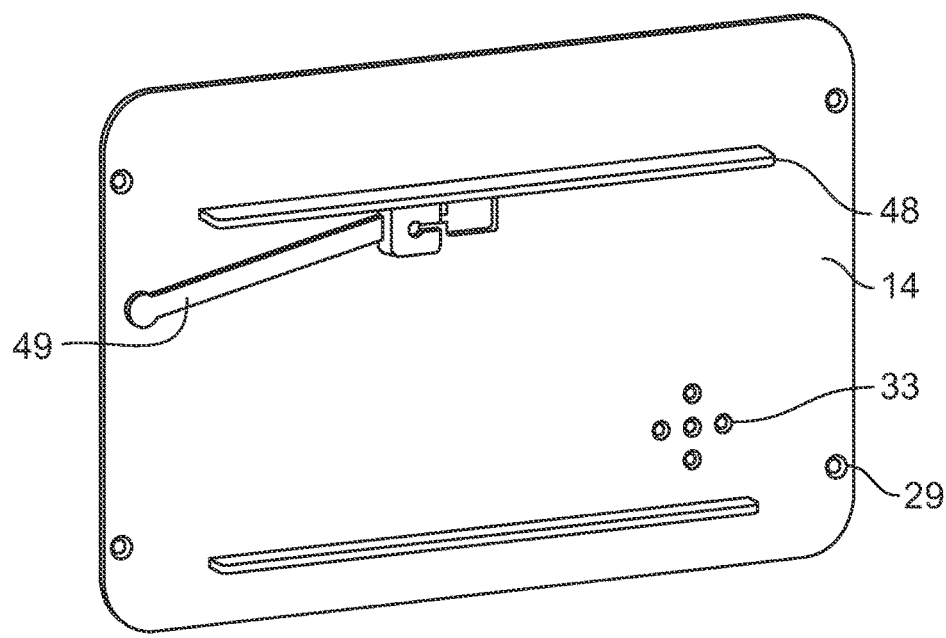
FIG. 5B is a rear perspective view of the rear panel of the housing in an embodiment of a shelf-mountable video display unit.

Some embodiments of the rear panel 14 may comprise one or more ribs 48, which are configured to provide the rear panel with a desired degree of stiffness. The one or more ribs 48 may be located anywhere on the rear panel 14. However, it may be desirable to include at least one rib 48 toward the top of the rear panel 14 and at least one rib toward the bottom of the rear panel, as is illustrated in FIG. 5B. The rear panel may also comprise a depression 49 that is configured to accept the cable that is connected or attached to the video component 11. The cable may reside in the depression 49 to be substantially even with the surface of the rear panel 14.

In some embodiments, the rear panel 14 of the housing may comprise a power connection port 28. The power connection port 28 is connected to the video component 11 and is configured to electrically connect the video component to an external power source, such as an independent battery pack 30, in order to provide power to the video component 11. The power connection port 28 may be either a female portion of a conventional electrical connection system or a male portion of a conventional electrical connection system. For example, the power connection port 28 may comprise a socket that mates with a male plug, such as a male barrel jack. In such an embodiment, the male plug is desirably located at the end of a cable that is attached to the external power source.

Alternatively, the video display unit 10 may be configured such that a cable 31 is attached to the video component 11 and extends through the rear panel 14 to mate with an external power source. In some embodiments, for instance, the cable 31 may mate with a power connection port 32 on an independent battery pack 30. For example, the cable 31 may terminate in a male connection, such as a male barrel jack, that is inserted into a female connection, such as a female barrel jack, on the battery pack 30. The cable 31 may also optionally comprise a strain relief feature near the video component 11. For example, the cable 31 may comprise a fitting that is configured to serve as a strain relief feature or the cable may simply be configured to include a small knot that serves as a strain relief feature.

In some embodiments, the connection between the video component 11 and the independent battery pack 30 may be configured such that a male end of the connection automatically disconnects from a female end of the connection in response to the application of force to the video display unit 10 in a direction away from the remote battery pack. In contrast, it has been found that conventional digital signage in the retail environment often suffers from a weakness that the cable providing power to the video unit is substantially locked into the video unit and the power source. Accordingly, when force is applied to the video display unit—as occasionally happens in the retail environment—the cable is not released. The excessive application of force therefore often results in the wires being torn out of the unit or the electrical connection otherwise being damaged.

By configuring the connection to disconnect from either the video component 11 or the battery pack 30 in response to the application of force, the video display unit 10 may be better able to withstand the stresses of the retail environment, leading to a product having a longer lifespan. For example, where a cable 31 is attached to the video component 11 and mates with a power connection port 32 on an independent battery pack 30, the plug at the end of the cable may be configured to release from the power connection port on the battery pack in response to an external force. The amount of force required to disconnect the male end of the connection from the female end of the connection may be selected depending on the expected stresses placed on the video display unit, as may be determined by a person of ordinary skill in the art depending on the specific retail environment.

While the connection above is described as being located at either the rear panel 14 of the video display unit 10 or at the independent battery pack 30, a person of skill in the art would also recognize that two or more cables may be used and that two cables may be connected to one another in such a manner that the two cables disconnect in response to an external force. For example, a first cable 31 terminating in a male end may extend from the video component 11 and a second cable terminating in a female end may extend from the battery pack 30, such that the first and second cables may be connected at a point between the video component and the battery pack, and wherein a force on the video unit causes the cables to disconnect from one another.

In some embodiments, the rear panel 14 of the housing also comprises one or more cavities 29 for receiving and mating with the screws or other fasteners 15 that secure the front panel 13 and the rear panel together. The rear panel 14 of the housing may also comprise a speaker opening 33 that is configured to align with a speaker 34 that may be integrated with the video component 11.

Figure 6A:
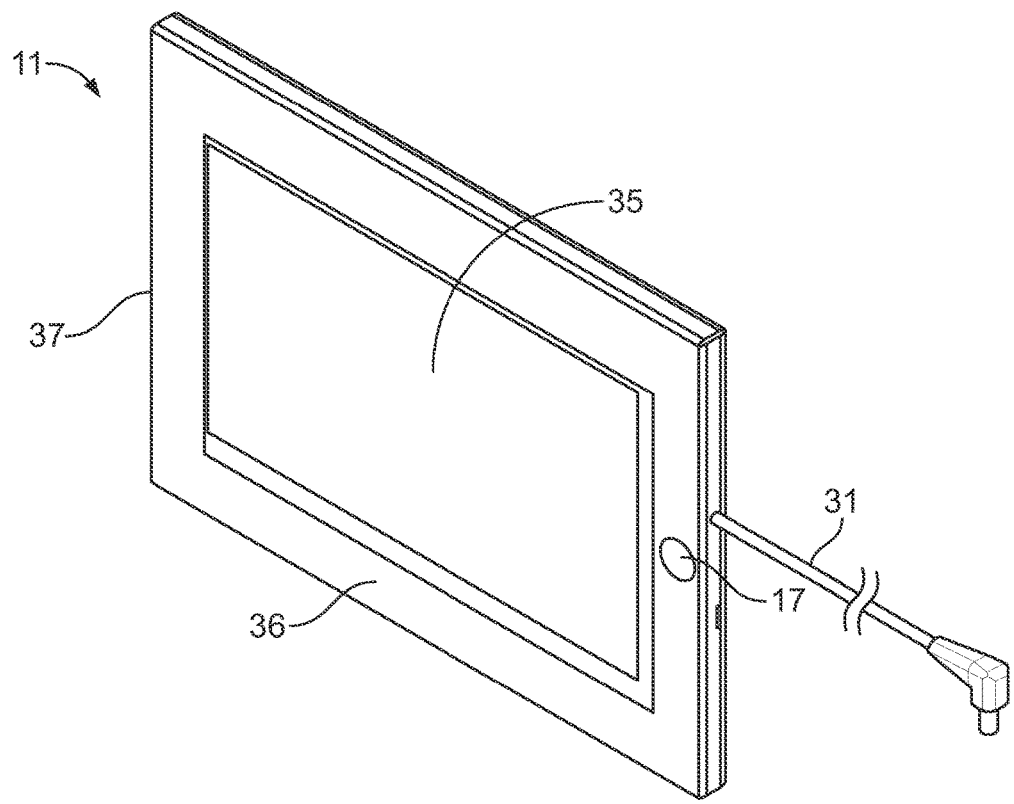
FIG. 6A is a front perspective view of the video component in an embodiment of a shelf-mountable video display unit.
Figure 6B:
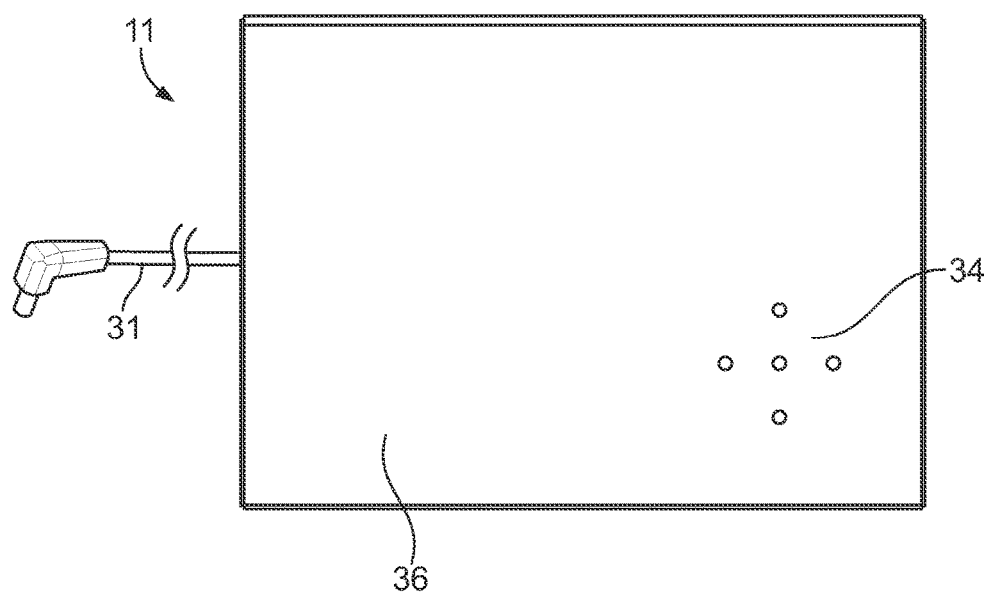
FIG. 6B is a rear elevation view of the video component in an embodiment of a shelf-mountable video display unit.

The video component 11, an embodiment of which is illustrated in FIGS. 6A and 6B, includes at least a video screen 35 and an integrated circuit. The video component 11 may comprise any low-cost media player, such as one that may comprise a small LCD screen and board assembly for the playing of video on the screen. For example, the video component 11 may comprise a low cost interactive video monitor, a video processor, a power supply socket, a video content reader, an integrated speaker, and/or one or more buttons enclosed in a wrapper made of paper or other low-cost material 36. The size of the screen may be selected depending on the desired use. In some embodiments, the video component may comprise a 4.3" screen, a 7" screen, or a 10" screen, although other screen sizes may also be used.

The video component may comprise a video content reader 37, such as a memory card slot. As such, the video component 11 may be configured to read video content from an SD memory card or the like. Accordingly, one may change the content shown by the video component 11 simply by placing a new memory card into the video content reader 37. In alternative embodiments, the video component 11 may comprise a pre-loaded and non-removable source of video content.

The video component 11 may also comprise one or more buttons 17 that are configured to activate the video component in order to initiate the playing of video content on the video screen. In some embodiments, such as the illustrated embodiment, the video component 11 may have only a single button 17. The single button 17 may activate a single video clip or the single button may activate a number of different video clips, such as a rotation of video clips. In other embodiments, the video component may comprise multiple buttons 17. The multiple buttons may each activate a different video clip or series of video clips. For example, in some embodiments, a video component may comprise up to six different buttons and may be configured to play up to six different video clips from a single memory card. The one or more buttons 17 are desirably configured to withstand the stresses of the retail environment. In many instances, it is desirable that the one or more buttons 17 be clearly visible on the front of the video display unit 10. Accordingly, for example, each of the one or more buttons may be a bright, easily identified color, such as red. In some embodiments, one or more buttons 17 may be lighted.

The video component 11 may also be configured to conserve energy. For example, the video component 11 may be connected to the external power supply so as to draw power from the power supply only when the button 17 is pushed. In other embodiments, the video component 11 may be configured to activate in response to a motion sensor. For example, a motion sensor may trigger a teaser message to encourage customer interaction. The teaser message could comprise audio, video, or both. In other embodiments, the video component 11 could be configured to play a teaser message either continuously or periodically in order to encourage activation and viewing of the main video messages by customers in the vicinity of the video display unit 10.

The video display unit 10 may also comprise a graphic border 16. The graphic border may contain images, text, or both that identify or describe particular products, brands, and/or retailers. The graphic border 16 may be made of any low-cost material, such as paper or card stock.

In some embodiments, the graphic border 16 is enclosed by the housing 12 and configured to surround the video screen 35. When the video display unit 10 is fully assembled, the graphic border 16 may be located in between the video component 11 and the face 19 of the front panel. The graphic border may be changed to customize the video display unit 10 simply by separating the front and rear panels of the housing 12 and by replacing an old graphic border 16 with a new one. This may be performed either at the same time that the video content is changed or independent from a change to the video content.

Figure 7:
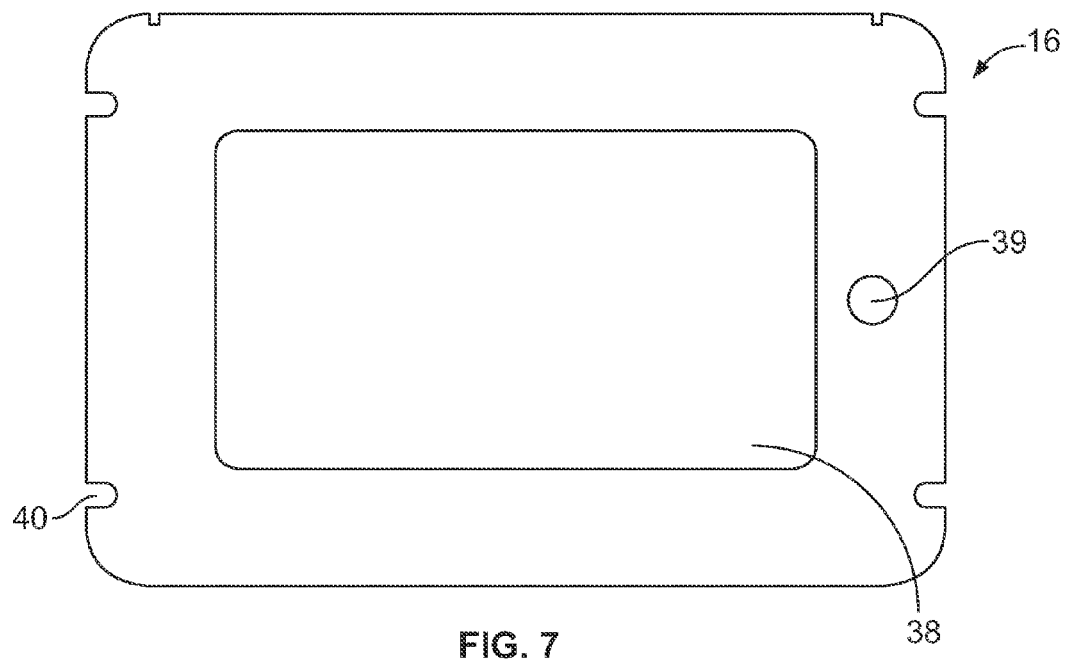
FIG. 7 is a front elevation view of the graphic border in an embodiment of a shelf-mountable video display unit.

An embodiment of a graphic border is shown in FIG. 7. The graphic border 16 comprises a video screen cut-out area 38 that is configured to align with the video screen and substantially matches the dimensions of the video screen 35. Where, for example, the border 16 is to be generally symmetric, the cut-out area 38 is desirably located in the center of the border, as illustrated. In some embodiments, the graphic border 16 may also comprise one or more button cut-outs 39, through which the one or more buttons 17 used to activate the video component 11 extend. An in some embodiments, the graphic border 16 may comprise one or more cut-outs 40 that are configured to partially surround the screws or other fasteners 15 that secure the front panel 13 to the rear panel 14 of the housing.

In other, nonillustrated embodiments, the graphic border 16 may be configured to be attached to the face of the front panel 13 of the housing so as to surround the video screen 35. For example, the graphic border 16 may comprise a label or decal that is configured to stick to the face of the front panel 13. In some embodiments, the front panel 13 may comprise one or more elements, such as clips, that are configured to hold the graphic border 16 in place on the front surface of the video display unit 10. And in some embodiments, such as where the front panel 13 is made from a printable material, the graphic border 16 may itself be an integral part of the face of the front panel. For example, an aluminum front panel 13 could be configured to comprise a built-in printed graphic border 16.

Figure 8:
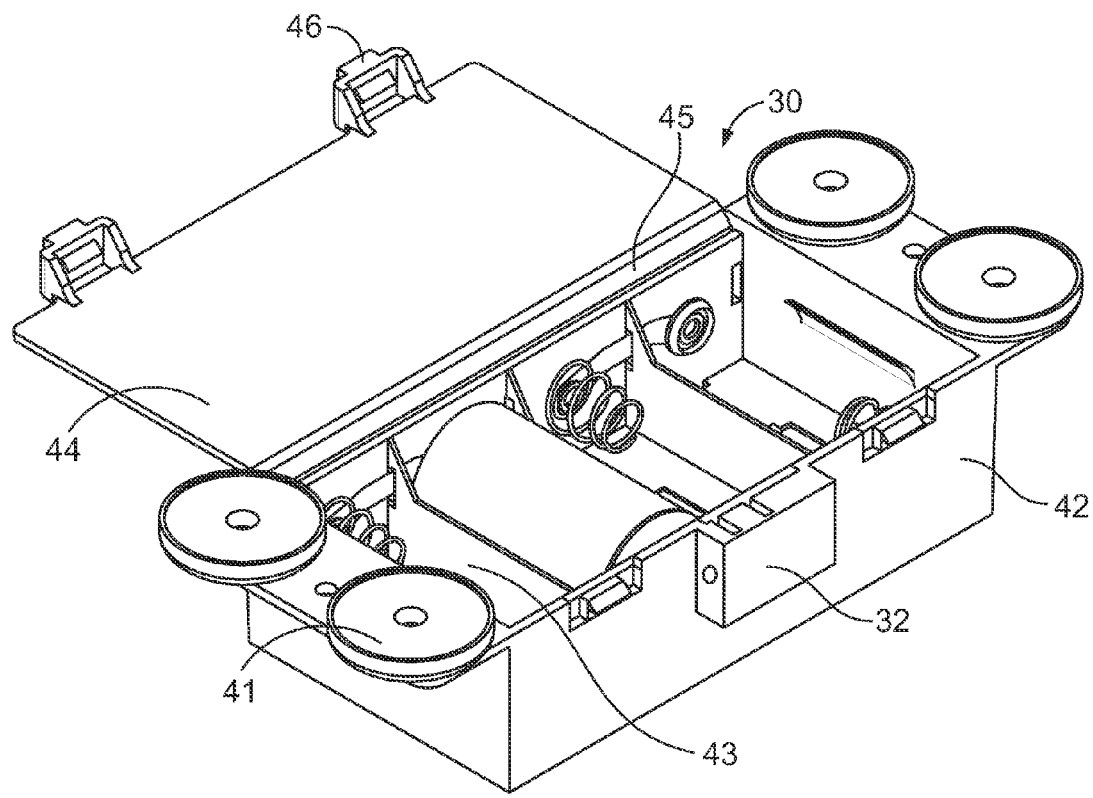
FIG. 8 is a front perspective view of the battery pack in an embodiment of a shelf-mountable video display unit.
Figure 9:
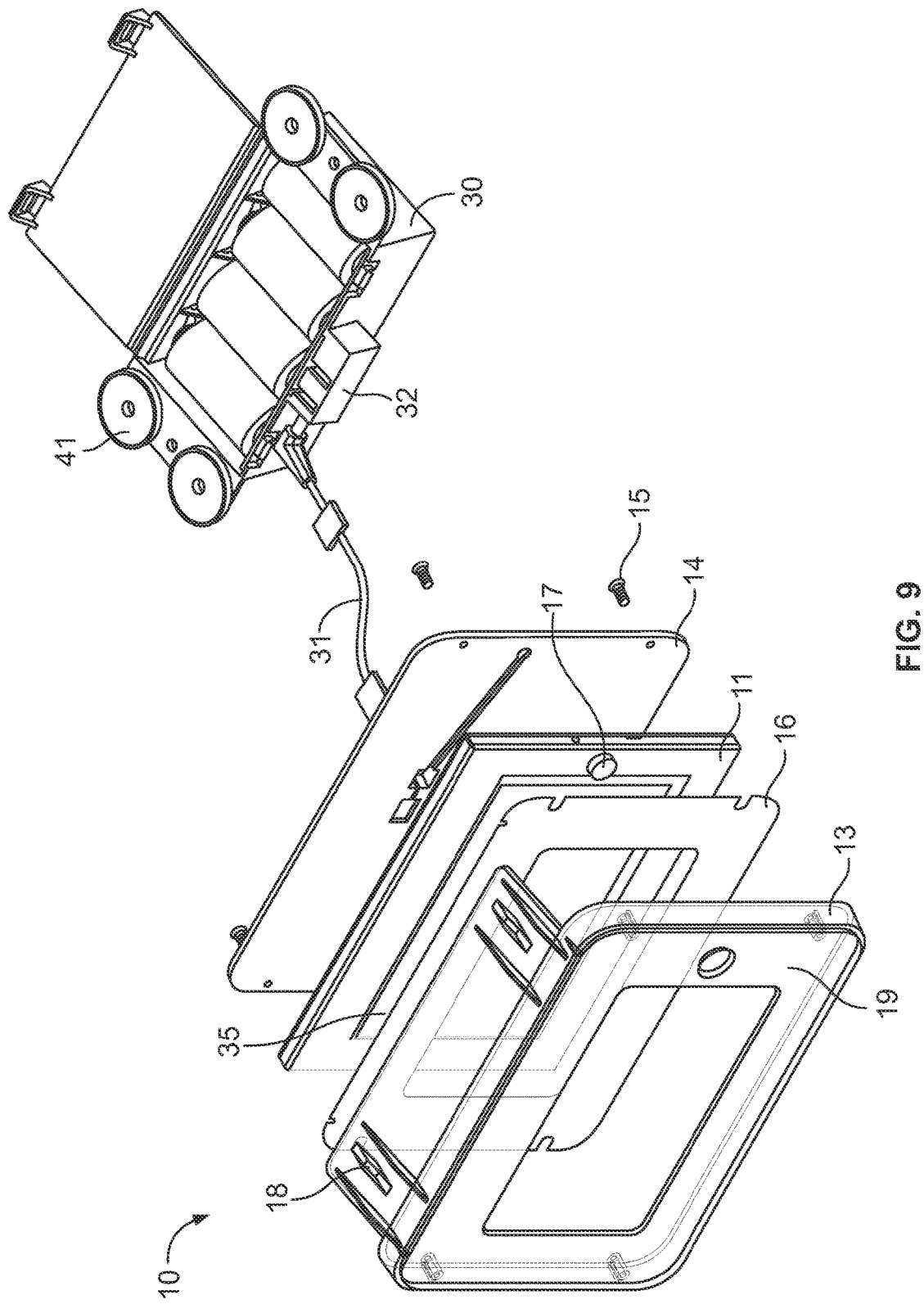
FIG. 9 is an exploded perspective view of an embodiment of a shelf-mountable video display unit.

The system may also comprise a remote battery pack 30 as an external power source for the video display unit 10. The remote battery pack 30 may be configured to mount to the retail shelf, desirably in such a manner as to be substantially concealed from the consumer. For example, the battery pack 30 may be configured to mount to an underside of the retail shelf, such as directly rearward from the video display unit 10. In the embodiment shown in FIG. 8, for example, the battery pack 30 comprises magnets 41 for attachment to the underside of a metal retail shelf. While the embodiment of FIG. 8 is shown as having four magnets, it should be understood that the battery pack 30 can be configured to have one or more magnets 41 and that varying the size, number, and location of the one or more magnets in order to provide a configuration that effectively attaches the battery pack 30 to a retail shelf is within the skill of one in the art. While magnets 41 provide for an uncomplicated mounting of the battery pack 30 to the underside of the shelf, other hardware fasteners such as screws, nuts, and plastic rivets may alternatively or additionally be used to mount the battery pack 30 to an underside of the shelf.

The battery pack 30 is also preferably configured of low-cost materials. For example, the battery pack 30 may comprise a housing 42 that is a polymeric material. In some embodiments, the housing 42 may be a single piece. As illustrated in the embodiment of FIG. 8, the housing 42 may comprise a battery storage compartment 43 and a lid 44.

Where the housing 42 is a single piece of plastic, the lid 44 may be connected to body of the housing, such as by a living hinge 45. For example, the lid 44 may be integrally molded with the body of the housing 42. The lid 44 is movable between a closed position, in which it covers and encloses the battery storage compartment 43, and an open position, in which the battery storage compartment is accessible. In some embodiments, the lid 44 may be located on the top of the housing 42, such that the lid is adjacent to the underside of a retail shelf, and thus cannot be opened, when the battery pack 30 is mounted on the underside of the retail shelf.

The lid 44 may also comprise one or more closure snaps 46, the closure snaps being configured to coordinate with a corresponding element on the body of the housing 42 in order to hold the lid in its closed position. The one or more closure snaps 46 are also configured such that they may be manipulated by a user in order to open the lid 44 and access the battery storage compartment 43. The closure snaps 46 may take on any number of forms, as would be understood by a person of skill in the art.

The battery pack housing 42 may be manufactured by conventional methods, such as injection molding or the like. The housing 42 may be manufactured from any low cost polymer, such as polyethylene, polypropylene, polyvinyl chloride (PVC), glycol-modified polyethylene terephthalate (PETG), or the like, or mixtures thereof. Because polypropylene is resistant to battery acid, in some embodiments, it may be desirable to provide a polypropylene housing 42. In some embodiments, the battery pack 30 may also comprise a battery holder unit that is placed within the housing 42. In those embodiments, the battery holder unit may desirably be made of polypropylene. The housing 42 may also be made from polypropylene, or it may be made from a different material, such as polyethylene or the like.

While the embodiment illustrated in FIG. 8 shows the battery pack 30 as holding four D cell batteries, a person of ordinary skill in the art would understand that the battery pack may be configured to hold any number and/or size of battery without departing from the scope of the invention. In some embodiments, the battery pack 30 may also comprise a polarity-protection feature, which prevents the battery pack from shorting out. In some embodiments, the remote battery pack 30 also desirably comprises a power connection port 50 that is configured to mate with the cable from the video component 11 in order to provide power to the video component, as previously described.

It can be seen that the described embodiments provide a unique and novel shelf-mountable video display unit that has a number of advantages over those in the art. While there is shown and described herein certain specific structures embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed:
1. A shelf-mountable video display unit comprising
 a. a video component comprising a video screen and an integrated circuit and configured for the playing of video on the screen;
 b. a housing that encloses the video component, the housing comprising a front panel and a rear panel that are detachably secured together, and
 in which the front panel comprises a face and a mounting element, the mounting element being configured to be secured to a retail shelf; and
 in which the face and the mounting element form an angle between 95 and 115 degrees.
2. The video display unit of claim 1 in which the face and the mounting element are integral.
3. The video display unit of claim 1 in which the front panel of the housing is made of a substantially transparent polymeric material.
4. The video display unit of claim 1, further comprising a graphic border surrounding the screen and enclosed by the housing.

5. The video display unit of claim 1, further comprising at least one button configured to activate the video component.

6. The video display unit of claim 1, in which the rear panel of the housing comprises one or more stabilizers configured to engage the retail shelf and restrict movement of the video display unit.

7. A shelf-mountable video display unit comprising
a. a video component comprising a video screen and an integrated circuit and configured for the playing of video on the screen;
b. a housing that encloses the video component, the housing comprising a front panel and a rear panel that are detachably secured together,
in which the front panel comprises a face and a mounting element, the mounting element being configured to be secured to a retail shelf; and
c. a battery pack, the battery pack being configured to mount to the underside of the retail shelf.

8. The video display unit of claim 7, in which a connection between the battery pack and the video component is configured to automatically disconnect in response to the application of force to the video display unit in a direction away from the battery pack.

9. The video display unit of claim 7, in which the battery pack comprises one or more magnets for attachment to the underside of a metal retail shelf.

10. The video display unit of claim 7, in which the battery pack comprises a housing and at least one mounting element, the housing being a single integral piece.

11. A shelf-mountable video display unit comprising
a. a video component comprising a video screen and an integrated circuit and configured for the playing of video on the screen from a memory card;
b. a housing that encloses the video component, the housing comprising a front panel and a rear panel that are secured together, the housing being configured to mount to a retail shelf such that the screen hangs below the shelf; and
c. a graphic border surrounding the screen;
in which the front panel and the rear panel of the housing are configured such that they may be separated in order to replace at least one of the memory card and the graphic border.

12. The shelf-mountable video display unit of claim 11, further comprising a battery pack, the battery pack being configured to mount to an underside of the retail shelf, and wherein the video component and battery pack are configured to be electrically connected by a cable.

13. The shelf-mountable video display unit of claim 12, in which the video component and the battery pack are configured to automatically disconnect in response to the application of force to the video display unit in a direction away from the battery pack.

14. The shelf-mountable video display unit of claim 12, in which the battery pack comprises one or more magnets for attachment to the underside of a metal retail shelf.

15. The shelf-mountable video display unit of claim 11, in which the front panel of the housing comprises a face and a mounting element, the face and the mounting element being integral, and the mounting element being configured to be secured to a retail shelf.

16. The shelf-mountable video display unit of claim 15, in which the front panel of the housing is made of a substantially transparent polymeric material.

17. The shelf-mountable video display unit of claim 15 in which the graphic border is enclosed by the housing.

18. The shelf-mountable video display unit of claim 11, further comprising at least one button configured to activate the video component.

19. The shelf-mountable video display unit of claim 11, in which the rear panel of the housing comprises one or more stabilizers configured to engage the retail shelf and restrict movement of the video display unit.

* * * * *